(12) United States Patent
Nagy et al.

(10) Patent No.: US 9,747,728 B2
(45) Date of Patent: Aug. 29, 2017

(54) VEHICLE APPARATUS

(75) Inventors: Oliver Nagy, Vienna (AT); Alexander Leopold, Vienna (AT)

(73) Assignee: Kapsch TrafficCom AG, Vienna (AT)

( * ) Notice: Subject to any disclaimer, the term of this patent is extended or adjusted under 35 U.S.C. 154(b) by 799 days.

(21) Appl. No.: 13/497,230

(22) PCT Filed: Sep. 15, 2010

(86) PCT No.: PCT/AT2010/000338
§ 371 (c)(1),
(2), (4) Date: Mar. 20, 2012

(87) PCT Pub. No.: WO2011/047395
PCT Pub. Date: Apr. 28, 2011

(65) Prior Publication Data
US 2012/0181859 A1    Jul. 19, 2012

(30) Foreign Application Priority Data
Oct. 20, 2009  (EP) .................................... 09450199

(51) Int. Cl.
*H01L 35/30* (2006.01)
*B60L 1/00* (2006.01)
*G07B 15/06* (2011.01)

(52) U.S. Cl.
CPC ............ G07B 15/063 (2013.01); H01L 35/30 (2013.01)

(58) Field of Classification Search
CPC .............................. G07B 15/063; H01L 35/30
USPC ......................................................... 307/150
See application file for complete search history.

(56) References Cited

U.S. PATENT DOCUMENTS

| 6,359,841 B1 * | 3/2002 | Kotanagi | G04C 10/00 136/205 |
| 6,591,610 B2 * | 7/2003 | Yazawa | F02G 1/043 337/140 |
| 7,493,974 B1 * | 2/2009 | Boncodin | B60K 16/00 180/2.2 |
| 7,653,394 B2 * | 1/2010 | McMillin | H04L 45/00 370/331 |

(Continued)

FOREIGN PATENT DOCUMENTS

| DE | 19549185 A1 | 7/1997 |
| DE | 102004043812 A1 | 3/2006 |

(Continued)

OTHER PUBLICATIONS

International Preliminary Report on Patentability dated on May 18, 2012 for corresponding PCT Application No. PCT/AT2010/000338, 7pp.

(Continued)

*Primary Examiner* — Jared Fureman
*Assistant Examiner* — Emmauel R Dominique
(74) *Attorney, Agent, or Firm* — Fiala & Weaver P.L.L.C.

(57) ABSTRACT

A vehicle device for a road tolling or road communication system for installation in a vehicle, comprising electronic components, which are supplied with energy by a thermoelectric generator, which produces electrical energy from a temperature difference present on two sides of the generator, wherein in the installed position of the vehicle device, one of said sides faces a window pane of the vehicle and the other of said sides faces the interior of the vehicle.

20 Claims, 3 Drawing Sheets

(56) References Cited

U.S. PATENT DOCUMENTS

| | | | |
|---|---|---|---|
| 8,418,477 B2* | 4/2013 | Klein | B60H 1/00264 62/235.1 |
| 2003/0097845 A1* | 5/2003 | Saunders | A41D 13/005 62/3.3 |
| 2003/0176900 A1* | 9/2003 | MacDonald | H02N 11/002 607/61 |
| 2003/0209014 A1* | 11/2003 | Chang | F25B 21/04 62/3.3 |
| 2004/0238022 A1* | 12/2004 | Hiller | H01L 29/155 136/203 |
| 2007/0096564 A1* | 5/2007 | Maeda | H02J 7/34 307/87 |
| 2007/0289620 A1* | 12/2007 | Stark | H01L 35/32 136/205 |
| 2008/0230653 A1* | 9/2008 | Mitchell | B60J 3/04 244/129.3 |
| 2008/0257395 A1* | 10/2008 | Jovanovic | H01L 29/155 136/239 |
| 2009/0014045 A1* | 1/2009 | Hines | H01L 35/34 136/200 |
| 2009/0272586 A1* | 11/2009 | Richter | F02G 5/00 180/54.1 |
| 2010/0083946 A1* | 4/2010 | Cedar | F23B 20/00 126/25 B |
| 2010/0208498 A1* | 8/2010 | Rubio | H02M 3/155 363/18 |

FOREIGN PATENT DOCUMENTS

| | | |
|---|---|---|
| DE | 102005040236 B3 | 1/2007 |
| DE | 102006035759 A1 | 2/2008 |
| DE | 102008030758 A1 | 1/2009 |
| WO | WO 94/01893 | 1/1994 |

OTHER PUBLICATIONS

Extended European Search Report received for European Patent Application No. 09450199.6, dated Feb. 16, 2010, 6 pages.

International Search Report received for PCT Patent Application No. PCT/AT2010/000338, dated Jan. 17, 2011, (3 pages English translation and 4 pages original document).

Written Opinion received for PCT Patent Application No. PCT/AT2010/000338, dated Jan. 17, 2011, (5 pages English translation and 5 pages original document).

* cited by examiner

VEHICLE APPARATUS

CROSS-REFERENCE TO RELATED APPLICATION(S)

This application is a National Phase Patent Application of International Application Number PCT/AT2010/000338, filed on Sep. 15, 2010, which claims priority to and the benefit of European Patent Application No. 09450199.6, filed Oct. 20, 2009.

FIELD OF THE INVENTION

The present invention pertains to a vehicle apparatus for a road toll or road communication system that is designed for being installed in a vehicle, wherein said vehicle apparatus contains electronic components.

BACKGROUND

Vehicle apparatuses with electronic components for road toll systems, so-called "onboard-units" (OBUs), are currently supplied with power by batteries that represent the largest component of such an OBU. Although the power consumption of an OBU lies in the range of micro watts ($\mu$W) and therefore is extremely low, the required service life of an OBU of more than 5 years results in a battery capacity of 100 mAh or greater, which requires that the batteries have a corresponding size.

SUMMARY

In some embodiments, the present invention is a vehicle apparatus for a road toll or road communication system to be installed in a vehicle that includes: electronic components configured to be supplied with energy by a thermal-electric generator that generates electrical energy from a temperature difference applied between two of its sides. One side of the thermal-electric generator is capable of being brought into intimate thermally conductive contact with an inside of a windowpane of the vehicle, in some embodiments directly or via an intermediately arranged thermally conductive layer in the installed position of the vehicle apparatus, and the other side is configured to face an interior of the vehicle.

In some embodiments, the apparatus is used for vehicles with windshield ventilation and the other side of the thermal-electric generator faces the windshield ventilation in the installed position of the vehicle apparatus. The thermal-electric generator may be accommodated in a housing of the vehicle apparatus with the electronic components, or it may be accommodated in a housing that is separated from the electronic components.

In some embodiments, the thermal-electric generator is at least one Seebeck element that may be configured to support the electronic components with power by an intermediate circuit for realizing a polarity reversal. Furthermore, the thermal-electric generator may be wired to an electric accumulator to buffer the electrical energy.

BRIEF DESCRIPTION OF THE DRAWINGS

The invention is described in greater detail below with reference to an exemplary embodiment that is illustrated in the attached drawings. In these drawings.

DETAILED DESCRIPTION

Figure 1:
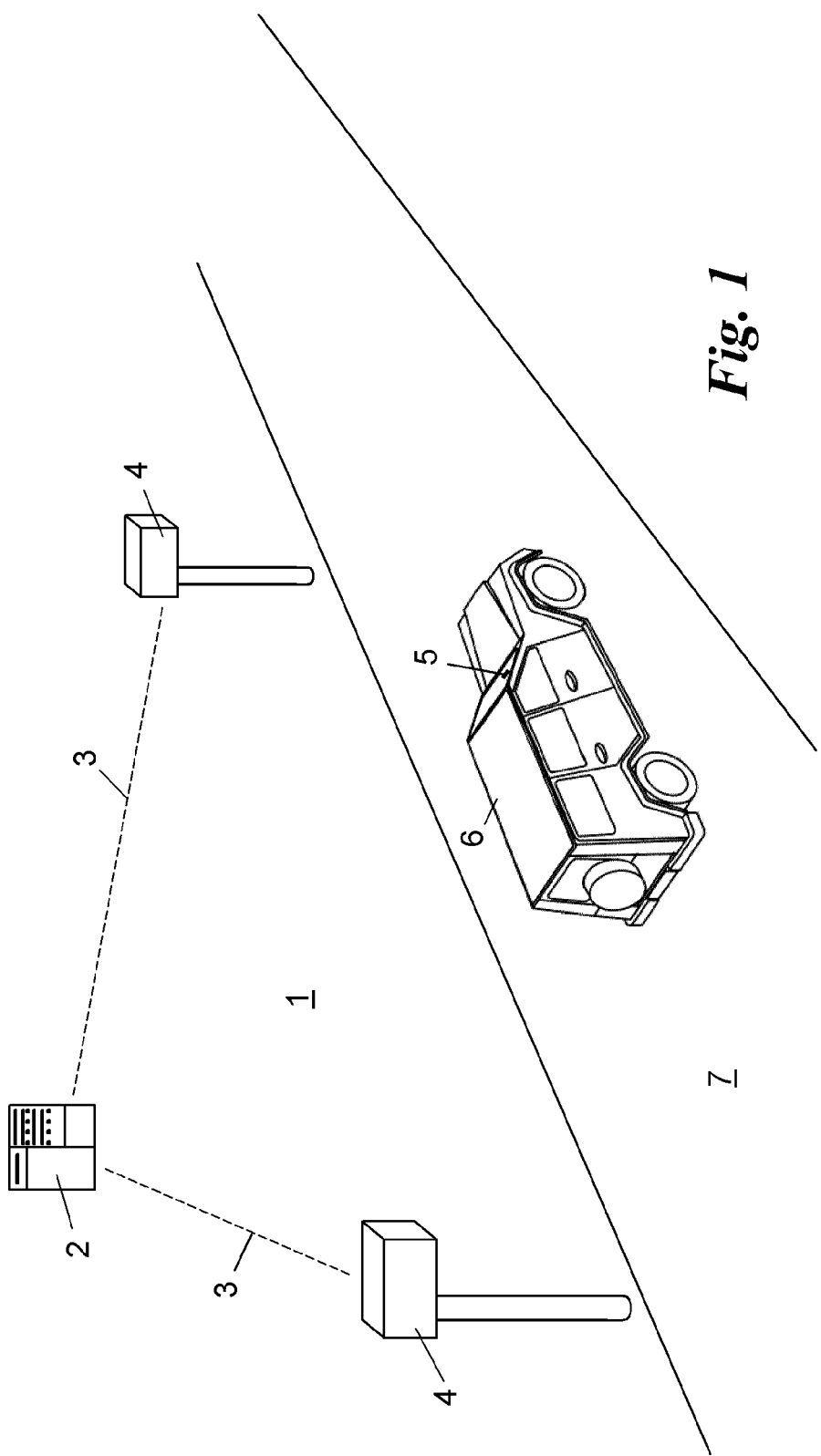
FIG. 1 shows a vehicle equipped with an inventive vehicle apparatus that forms part of a schematically illustrated road toll system.

It is basically known from DE 10 2008 030 758 A1 to supply a tire pressure sensor with energy by means of a thermal-electric generator in the vehicle that is exposed to incident solar radiation.

The applicant has recognized for the first time that thermal-electric generators are particularly suitable for the energy supply of OBUs. That is, the significant temperature fluctuations that regularly occur, particularly in vehicles, and can be used for generating temperature differences, e.g., between the vehicle interior and the vehicle exterior or a side of the vehicle apparatus that is exposed to incident solar radiation and a shaded side thereof. The present invention makes it possible for the thermal-electric generator to not only utilize the incident solar radiation underneath the windowpane, but also the contact temperature of the windowpane itself for generating a temperature difference. For example, a windowpane that is cooled by the airstream during the winter months is cold in comparison with a heated vehicle interior. Similarly, a windowpane that is heated by the sun and the airstream during the summer months is hot in comparison with an air-conditioned vehicle interior. However, smaller temperature differences that are caused by day/night fluctuations of the air temperature and their time-delayed effect on the vehicle interior or by passing through sunlit/shaded areas or different air layers while driving can also be used for generating energy in this way. According to studies carried out by the applicant, these temperature differences are more than sufficient for supplying an OBU with energy in a self-sufficient fashion.

Thermal-electric generators of the aforementioned type can be manufactured with a flat shape, e.g., in the form of semiconductor chips, such that they can be arranged over a large area on one side of the vehicle apparatus and do not require any noteworthy installation space. OBUs according to the present invention therefore can be manufactured significantly flatter than conventional OBUs that have batteries or accumulators. Since the service life of the OBU is no longer limited by the capacity of a battery, the OBU has a theoretically unlimited service life.

The thermal-electric generator may be accommodated in a housing of the vehicle apparatus together with the electronic components. Alternatively, the thermal-electric generator may be accommodated in its own housing that is separated from the electronic components.

Moreover, the vehicle apparatus may have a flat housing and where one side is exposed on the rear side of the housing. This embodiment is particularly suitable for directly contacting the windowpane or for exposing the first side to sunlight.

In some embodiments, the other side of the housing faces a windshield ventilation of the vehicle in the installed position of the vehicle apparatus. In this way, the outlet temperature of a fan-assisted heater or air-conditioning system of the vehicle can be directly utilized for generating a temperature difference.

If the vehicle apparatus has a flat housing, the other side may be connected to the interior of the vehicle via ventilation openings in the housing. The ventilation openings can be directed downward and therefore directly toward the air outlet nozzles of a windowpane ventilation.

According to some embodiments of the invention, the vehicle apparatus can be adhesively attached to the inside of the windowpane. This eliminates the need for complicated installation structures for the vehicle apparatus and promotes a direct thermally conductive contact between the windowpane and the thermal-electric generator over the entire surface area thereof.

The thermal-electric generator can be of any type known in the art, which is capable of generating electrical energy from a temperature difference between two of its sides. In some embodiments, the thermal-electric generator is at least one Seebeck element (so-called "reverse Peltier element") that is characterized by a flat design and a high efficiency. The thermal-electric generator may include an array containing a plurality of interconnected Seebeck elements.

The temperature difference utilized within the scope of the present invention may occur in any direction, i.e., between a warm vehicle interior and a cold windowpane or a shaded side of the vehicle apparatus and vice versa also, between a cold vehicle interior and a warm windowpane or a side of the vehicle apparatus that is exposed to the sun. Since the polarity of the output voltage generated by the Seebeck element depends on the direction of the temperature difference, it is particularly advantageous if the Seebeck element supplies the electronic components via an intermediate circuit for realizing a polarity reversal such that temperature differences in both directions can be utilized for the energy supply.

In some embodiments, the thermal-electric generator is connected to an electric accumulator for buffering the electrical energy so that a continuous energy supply of the vehicle apparatus can also be ensured during an occasional temperature equalization.

Investigations carried out by the applicant have shown that merely the temperature differences between the vehicle interior and the surroundings that occur in the morning and evening hours and that are caused by the delayed temperature equalization of the daytime temperature fluctuations suffice for consistently recharging the accumulator and, averaged over time, generating more than sufficient electrical energy for the OBU. Even a relatively small accumulator suffices for this purpose, for example, a simple capacitor that requires a small space.

FIG. 1 shows an exemplary and only sectionally illustrated road toll system 1 with a toll center 2 that is connected to a plurality of transmitting-receiving stations 4 via a data network 3 such as, for example, an intranet, the Internet, or a mobile communications network. The transmitting-receiving stations 4 may be realized in any suitable way such as, for example, in the form of roadside radio beacons according to the dedicated short range communication standard (DSRC) or wireless access in vehicular environments standard (WAVE) or in the form of base stations of a cellular mobile communications network that operates, e.g., in accordance with the GSM standard. The toll center 2 communicates with vehicle apparatus or OBU 5 carried by vehicle 6 via the transmitting-receiving station 4 to calculate the charges for the use of traffic area 7, such as roads, highways, parking lots, etc., by said vehicle.

According to the present invention, the OBU 5 may be realized in any suitable way such as, e.g., so-called "thin client" that can be localized by transmitting-receiving station 4 in the form of, e.g., DSRC radio beacons that signal the location of the OBU 5 to the toll center 2 to calculate the corresponding charges. Alternatively, the OBU may include a so-called "thick client" that can determine its location, for example, by identifying the location of the transmitting-receiving station 4, by self-localization in a mobile communications network with the aid of the transmitting-receiving station 4 or even a suitable satellite navigation receiver for a global navigation satellite system (GNSS). Thick client OBU 5 can transmit its location directly to the toll center 2 for evaluation purposes or determine road segments that are subject to tolls with the aid of suitable maps, and send location-anonymized toll datasets to the toll center 2. Thin client OBU, in contrast, usually send only its identification to the transmitting-receiving station 4 that generates toll datasets for the center 2 thereof.

Figure 2:
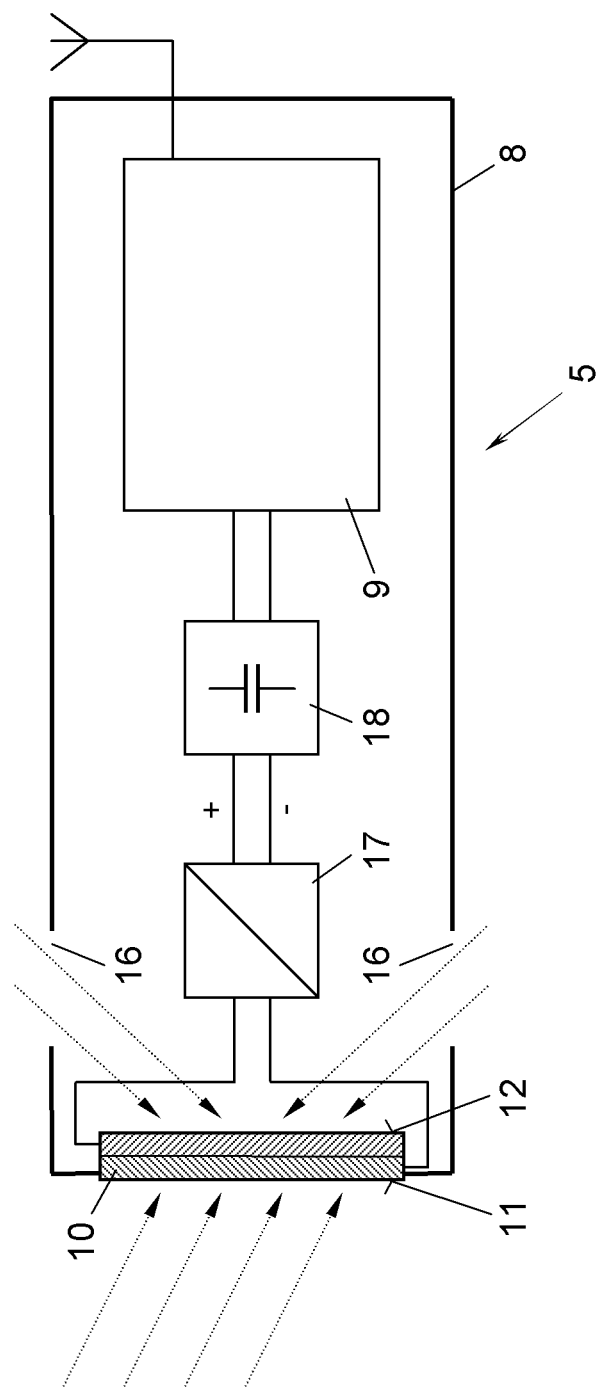
FIG. 2 shows a block diagram of the vehicle apparatus according to FIG. 1.

According to FIG. 2, in a housing 8, the OBU 5 comprises electronic components 9 that are not illustrated in greater detail, e.g., a microprocessor, a memory, and transmitting and receiving devices of any type, e.g., GSM, DSRC, WAVE, or RFID communication modules together with their peripheral electronics.

In order to supply the electronic components 9 of the OBU 5 with electrical energy, a thermal-electric generator 10 is provided that can generate electrical energy from a temperature difference between two of its sides, 11 and 12. One example of such a thermal-electric generator 10 is a flatly shaped Seebeck element, so-called "reverse Peltier element", to the flat sides 11 and 12, of which the temperature difference needs to be applied. In some embodiments, such a Seebeck element is composed of an array of several "individual" Seebeck elements that are connected in parallel and/or in series.

Figure 4:
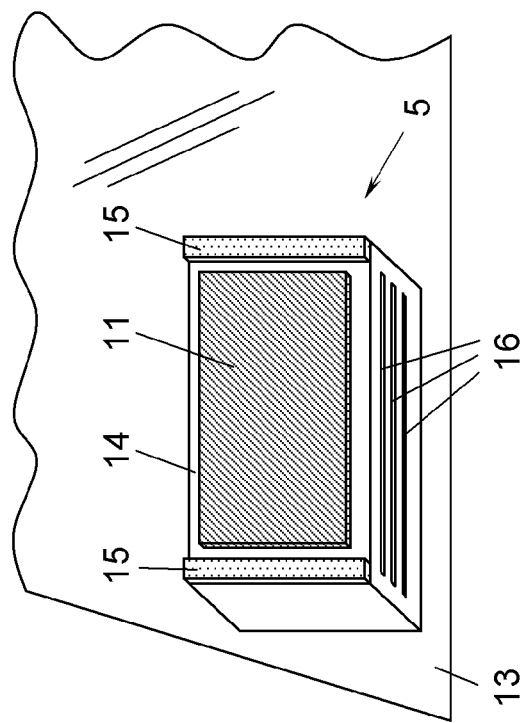
FIGS. 3 and 4 show perspective front and rear views of the vehicle apparatus according to FIG. 2 in the installed position on a windowpane.
Figure 3:
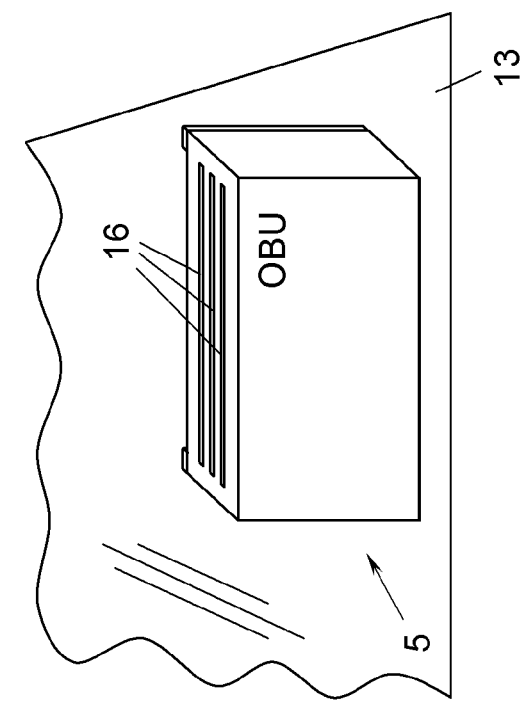

FIGS. 3 and 4 show the installed position of the OBU 5 on a windowpane 13 of the vehicle 6. The windowpane 13 is the front windshield of the vehicle 6 and may include any other glass windowpane of the vehicle 6 or even of a windowpane that is not made of glass, e.g., a windowpane-like part of the vehicle body.

The side 11 of the thermal-electric generator 10 is exposed on the rear side 14 of the housing 8 of the OBU 5 and faces the windowpane 13 such that it is exposed to the solar radiation incident through the windowpane 13. Although the OBU 5 could, in principle, be arranged at a distance from the windowpane 11, it is preferably fixed directly on the windowpane 13. In this way, the side 11 of the thermal-electric generator 10 can contact the inside of the windowpane 13 over its entire surface area with the aid or intermediate arrangement of a thermally conductive layer, e.g., a thermally conductive film, a thermally conductive paste, a thermally conductive cushion, and the like, to realize an adequate heat transfer between the windowpane 13 and the side 11.

In some embodiments, the OBU 5 and/or the thermal generator 10 may be fixed on the windowpane 3 by a removable bracket.

If the windowpane 13 is a metalized type, the OBU 5 may be adhesively attached to the inside of the windowpane 13 in the region of a recess of the metallization.

In order to fix the OBU 5 on the windowpane 13, the rear side 14 of the OBU 5 may be provided with adhesive strips 15 and/or the side 11 of the thermal-electric generator 10 and/or the intermediately arranged thermally conductive paste may be realized in a self-adhesive fashion.

The other side 12 of the thermal-electric generator 10 faces the interior of the vehicle 6 such that it is subjected to the interior temperature of the vehicle 6. In some embodiments, the housing 8 is provided with ventilation openings 16. The ventilation openings 16 are arranged such that they can be directed directly at the air outlet slots of a conventional windshield ventilation of the vehicle 6 to take in the heated or cooled air of a heater or air-conditioning system of the vehicle 6.

The temperature difference occurring on the two sides 11, 12 of the thermal-electric generator 10 is converted into an electric voltage by the thermal-electric generator 10. The polarity of this electric voltage depends on the direction and the intensity of the temperature difference, i.e., the temperature gradient. Consequently, the thermal-electric generator 10 supplies the components 9 with power via an intermediate circuit 17 to generate a unipolar supply voltage from the voltage of the thermal-electric generator 10 that is polarized according to the temperature. The intermediate circuit 17 includes, for example, a rectifier. In addition, an electric accumulator (energy storage) 18 such as, for example, a capacitor with corresponding wiring may be provided to intermediately store or buffer the electrical energy generated by the thermal-electric generator 10.

The thermal-electric generator 10 may be arranged in the same housing 8 as the electronic components 9. If so required, the thermal-electric generator, and optionally the circuit components 17 and 18, could be arranged in its own housing that is separated from the housing 8 and the components 9 contained therein and connected to the housing 8 and the components 9 via corresponding connecting lines.

The described vehicle apparatuses 5 do not have to form part of road toll systems, but are also suitable for other purposes, e.g., as vehicle navigation devices, vehicle onboard computers, vehicle communication devices and the like. Accordingly, the invention is not limited to the illustrated embodiments, but rather also includes all variations and modifications within the scope of the attached claims.

The invention claimed is:

1. A vehicle apparatus installed in a vehicle for use in a road toll or road communication system, comprising:
   electronic components configured to communicate with a toll center, the electronic components configured to be supplied with energy by a thermal-electric generator that generates electrical energy from a temperature difference applied between two-sides of the thermal-electric generator, wherein a first side of the thermal-electric generator is in intimate thermally conductive contact with an inside of a windowpane of the vehicle and wherein a second side of the thermal-electric generator opposing the first side of the thermal-electric generator is configured to face an interior of the vehicle; and
   a flat housing wherein the second side of the thermal-electric generator is capable of being connected to the interior of the vehicle via ventilation openings in the housing;
   wherein the windowpane is the front windshield of the vehicle.

2. The vehicle apparatus according to claim 1 for vehicles with windshield ventilation, wherein the second side of the thermal-electric generator is configured to face an air outlet of the windshield ventilation in the interior of the vehicle.

3. The vehicle apparatus according to claim 1, wherein the thermal-electric generator is accommodated in a housing of the vehicle apparatus with the electronic components.

4. The vehicle apparatus according to claim 1, wherein the thermal-electric generator is accommodated in a housing that is separated from the electronic components.

5. The vehicle apparatus according to claim 1, wherein the first side of the thermal-electric generator is exposed on a side of the housing.

6. The vehicle apparatus according to claim 1, capable of being adhesively attached to the inside of the windowpane.

7. The vehicle apparatus according to claim 1, wherein the thermal-electric generator is at least one Seebeck element.

8. The vehicle apparatus according to claim 1, further comprising an intermediate circuit that generates a unipolar supply voltage from a voltage of the electrical energy generated by the thermal-electric generator that is polarized according to the temperature difference, the thermal-electric generator supplying the electronic components with the energy via the intermediate circuit.

9. The vehicle apparatus according to claim 1, wherein the thermal-electric generator is wired to an electric accumulator to buffer the electrical energy.

10. The vehicle apparatus according to claim 1, wherein the accumulator is a capacitor.

11. A vehicle apparatus to be installed in a vehicle for use in a road toll or road communication system, comprising:
    electronic components configured to communicate with a toll center, the electronic components configured to be supplied with energy by a thermal-electric generator that generates electrical energy from a temperature difference applied between two sides of the thermal-electric generator, wherein a first side of the thermal-electric generator is capable of being brought into intimate thermally conductive contact with an inside of a windowpane of the vehicle and wherein a second side of the thermal-electric generator opposing the first side of the thermal-electric generator is configured to face an interior of the vehicle; and
    a housing that contains at least the thermal-electric generator, wherein the second side of the thermal-electric generator is capable of being thermally connected to the interior of the vehicle via ventilation openings in the housing, and wherein, in an installed position of the vehicle apparatus, the second side of the thermal-electric generator is configured to face an air outlet of a windshield ventilation of the vehicle in the interior of the vehicle through said ventilation openings in the housing.

12. The vehicle apparatus according to claim 11, wherein in the installed position of the vehicle apparatus said first side is directly in thermally conductive contact with the inside of the windowpane via an opening in a side of the housing.

13. The vehicle apparatus according to claim 11, wherein in the installed position of the vehicle apparatus said first side is in thermally conductive contact with the inside of the windowpane via an intermediately arranged thermally conductive layer via an opening in a side of the housing.

14. The vehicle apparatus according to claim 11, further comprising an intermediate circuit that generates a unipolar supply voltage from a voltage of the electrical energy generated by the thermal-electric generator that is polarized according to the temperature difference, the thermal-electric generator supplying the electronic components with the energy via the intermediate circuit.

15. The vehicle apparatus according to claim 11, wherein the thermal-electric generator is accommodated in the housing of the vehicle apparatus with the electronic components.

16. The vehicle apparatus according to claim 11, wherein the thermal-electric generator is accommodated in the housing separately from the electronic components.

17. The vehicle apparatus according to claim 11, wherein the housing is flat.

18. The vehicle apparatus according to claim 11, wherein the vehicle apparatus is capable of being adhesively attached to the inside of the windowpane.

19. The vehicle apparatus according to claim 11, wherein the thermal-electric generator is at least one Seebeck element.

20. The vehicle apparatus according to claim 8, wherein the intermediate circuit is a rectifier circuit.

* * * * *